United States Patent
Umetsu

(10) Patent No.: US 10,626,301 B2
(45) Date of Patent: Apr. 21, 2020

(54) METHOD FOR MANUFACTURING LIGHT EMITTING DEVICE

(71) Applicant: DEXERIALS CORPORATION, Tokyo (JP)

(72) Inventor: Norio Umetsu, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/550,544

(22) PCT Filed: Mar. 10, 2016

(86) PCT No.: PCT/JP2016/057527
§ 371 (c)(1),
(2) Date: Aug. 11, 2017

(87) PCT Pub. No.: WO2016/148004
PCT Pub. Date: Sep. 22, 2016

(65) Prior Publication Data
US 2018/0037773 A1 Feb. 8, 2018

(30) Foreign Application Priority Data
Mar. 18, 2015 (JP) .................. 2015-055406

(51) Int. Cl.
*C09J 5/06* (2006.01)
*C09J 9/02* (2006.01)
(Continued)

(52) U.S. Cl.
CPC ............. *C09J 5/06* (2013.01); *C08G 59/70* (2013.01); *C09J 9/02* (2013.01); *C09J 11/06* (2013.01);
(Continued)

(58) Field of Classification Search
CPC ....... C09J 5/06; C09J 9/02; C09J 11/06; C09J 183/04; C08G 59/70; C23C 14/025;
(Continued)

(56) References Cited

U.S. PATENT DOCUMENTS

2007/0001313 A1\* 1/2007 Fujimoto ................ H01L 24/11
257/778
2012/0255766 A1 10/2012 Igarashi
(Continued)

FOREIGN PATENT DOCUMENTS

| CN | 102939645 A | 2/2013 |
| CN | 103965581 A | 8/2014 |

(Continued)

OTHER PUBLICATIONS

Sep. 7, 2018 Extended European Search Report issued in European Patent Application No. 16764834.4.
(Continued)

*Primary Examiner* — Michael N Orlando
*Assistant Examiner* — Elizabeth Bradford
(74) *Attorney, Agent, or Firm* — Oliff PLC

(57) ABSTRACT

A light emitting device is manufactured by bonding an LED element on a wiring board using an anisotropic conductive adhesive. In the manufacture, the anisotropic conductive adhesive is disposed on the wiring board, and the LED element is disposed thereon. A polymerizable epoxy-modified silicone resin and a metal chelate compound are contained in the anisotropic conductive adhesive in advance. A pressing unit is pressed against the LED element for a certain pressing time, while the temperature of the wiring board is kept at 160° C. or higher and 210° C. or lower, and the temperature of the pressing unit is set lower than that of the wiring board. Since the reaction between the epoxy-modified silicone resin and the metal chelate compound
(Continued)

occurs at a low temperature, the LED element is temporarily connected to the wiring board without collapse of a fluorescent layer.

8 Claims, 3 Drawing Sheets

(51) Int. Cl.
    *C09J 11/06*     (2006.01)
    *C09J 183/04*     (2006.01)
    *H01L 33/62*     (2010.01)
    *C08G 59/70*     (2006.01)
    *C23C 14/02*     (2006.01)
    *H01L 23/00*     (2006.01)
    *H01L 33/48*     (2010.01)
    *H01L 33/64*     (2010.01)
    *H05K 3/32*     (2006.01)

(52) U.S. Cl.
    CPC ........... *C09J 183/04* (2013.01); *C23C 14/025* (2013.01); *H01L 24/29* (2013.01); *H01L 33/486* (2013.01); *H01L 33/62* (2013.01); *H01L 33/641* (2013.01); *H01L 2224/29298* (2013.01); *H01L 2924/07811* (2013.01); *H01L 2924/12041* (2013.01); *H05K 3/321* (2013.01); *H05K 2201/10106* (2013.01)

(58) Field of Classification Search
    CPC ....... H01L 24/29; H01L 33/486; H01L 33/62; H01L 33/641
    USPC ...................................... 156/275.5
    See application file for complete search history.

(56) References Cited

U.S. PATENT DOCUMENTS

2014/0239331 A1     8/2014   Oyu et al.
2015/0353781 A1    12/2015   Namiki et al.

FOREIGN PATENT DOCUMENTS

| | | |
|---|---|---|
| JP | 2010-024301 A | 2/2010 |
| JP | 2011-137117 A | 7/2011 |
| JP | 2011-222830 A | 11/2011 |
| JP | 2012-186322 A | 9/2012 |
| JP | 2012-216712 A | 11/2012 |
| JP | 2013-179215 A | 9/2013 |
| JP | 2013-541805 A | 11/2013 |
| JP | 2014-067507 A | 4/2014 |
| JP | 2014-141610 A | 8/2014 |
| JP | 2014-159499 A | 9/2014 |
| KR | 2012-0135006 A | 12/2012 |
| WO | 2014/132979 A1 | 9/2014 |

OTHER PUBLICATIONS

Apr. 12, 2016 International Search Report issued in Patent Application No. PCT/JP2016/057527.
Dec. 6, 2019 of ie Action issued in Chinese Patent Application No. 201680013081.6.
Oct. 23, 2018 Office Action Issued in Chinese Patent Application No. 201680013081.6.
Jun. 4, 2019 Office Action Issued in Taiwanese Patent Application No. 105108060.
Jul. 9, 2019 Office Action Issued in Chinese Patent Application No. 201680013081.6.
Aug. 22, 2018 Office Action issued in Korean Patent Application No. 10-2017-7022081.

\* cited by examiner (a)

(b)

(c)

(d)

METHOD FOR MANUFACTURING LIGHT EMITTING DEVICE

TECHNICAL FIELD

The present invention relates to a technique for manufacturing a light emitting device using an LED element, and in particular, to a technique for fixing an LED element having a fluorescent layer to a wiring board.

BACKGROUND ART

As a method for mounting a chip component such as an LED on a circuit board, a method in which the chip component is flip-chip mounted using an anisotropic conductive adhesive in which conductive particles are dispersed in an epoxy-based adhesive has been widely adopted (for example, refer to Patent Literatures 1 and 2). According to this method, since the conductive particles contained in the anisotropic conductive adhesive electrically connect the chip component to the circuit board, it is possible to reduce time required for a connection process and improve production efficiency.

Currently, white light emitting devices using an LED element having a fluorescent layer are in the mainstream of lighting devices, and various techniques have been developed. For example, there is a technique in which solder is used for bumps, and an LED element is connected to a wiring board by reflow soldering (Patent Literatures 3 and 4, and the like). However, the reflow soldering by thermosonic bonding or the like has a problem that exfoliation may occur between a body semiconductor chip configured to emit light and a fluorescent layer configured to change the emitted light into white light. When the body semiconductor chip is fixed to the wiring board only by soldering, the body semiconductor chip may exfoliate from the wiring board.

As measures against this, there may be mentioned a method in which flux is applied to a surface of the wiring board, a method in which a weight is applied during the reflow soldering, and the like. However, there are problems that the fluorescent layer tends to exfoliate during cleaning of the flux, and the application of the weight under high temperature collapses the fluorescent layer.

CITATION LIST

Patent Literature

Patent Literature 1: Japanese Patent Application Laid-Open No. 2010-24301
Patent Literature 2: Japanese Patent Application Laid-Open No. 2012-186322
Patent Literature 3: Japanese Patent Application Laid-Open No. 2012-216712
Patent Literature 4: Japanese Patent Application Laid-Open No. 2013-541805

SUMMARY OF INVENTION

Technical Problem

The present invention has been created to solve the inconvenience of the above-described conventional techniques. An object of the present invention is to provide a technique for obtaining a light emitting device without breaking a fluorescent layer.

Solution to Problem

The inventor of the present invention has found that polymerization reaction of an epoxy-modified silicone resin proceeds at a lower temperature when a metal chelate compound is used as a curing agent than when an acid anhydride or an imidazole compound is used as a curing agent, and a long thermal compression bonding time and a high thermal compression bonding temperature cause collapse of a fluorescent layer in temporal connection between an LED element and a wiring board. The inventor has therefore made the present invention in which lowering the temperature of the wiring board during the temporal connection and adopting the metal chelate compound allow the polymerization reaction of the epoxy-modified silicone resin contained in an anisotropic conductive adhesive with the metal chelate compound at a low temperature and in a short time, in the process of temporarily connecting the LED element using the anisotropic conductive adhesive. To lower the temperature of the fluorescent layer, the temperature of a pressing unit may be set lower than that of the wiring board.

From the viewpoint described above, the present invention is a method for manufacturing a light emitting device including: a disposition step of disposing an LED element on an anisotropic conductive adhesive, which contains a polymerization component and a curing agent and which is disposed on a wiring board; a primary heating step of increasing a temperature of the anisotropic conductive adhesive to cause a polymerization reaction of part of the polymerization component with the curing agent, while a pressing unit presses the LED element for a certain pressing time, to temporarily connect the LED element to the wiring board; and a secondary heating step of increasing temperatures of the wiring board, the anisotropic conductive adhesive, and the LED element, which are temporarily connected, to make final connection by the polymerization reaction of the polymerization component and curing of the anisotropic conductive adhesive. In this method, the LED element has a fluorescent layer, the polymerization component contains an epoxy-modified silicone resin, a metal chelate compound is used as the curing agent, and in the primary heating step, the wiring board is pressed at a temperature of 160° C. or higher and 210° C. or lower for the certain pressing time.

In the method for manufacturing a light emitting device according to the present invention, the pressing time is 60 seconds or less.

In any one of the above-described methods for manufacturing a light emitting device, the temperature of the wiring board is set lower in the secondary heating step than in the primary heating step, and a heating time for heating the wiring board in the secondary heating step is set longer than the pressing time.

In any one of the above-described methods for manufacturing a light emitting device, the temperature of the pressing unit is kept at 20° C. or higher and 40° C. or lower.

Advantageous Effects of Invention

Since no flux is used, a cleaning step is eliminated. Furthermore, the fluorescent layer does not collapse, thus improving an yield rate.

DESCRIPTION OF EMBODIMENTS

<Anisotropic Conductive Adhesive>

Figure 1:
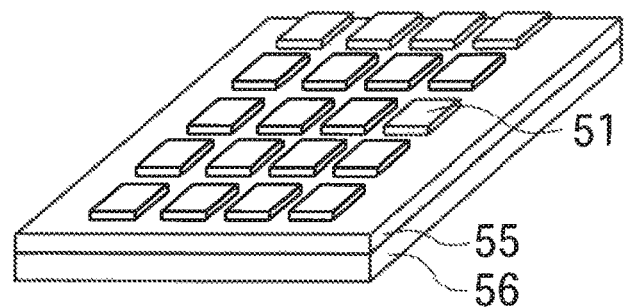
FIGS. 1(a) to 1(d) are perspective views for explaining a manufacturing process of the present invention.
Figure 1:
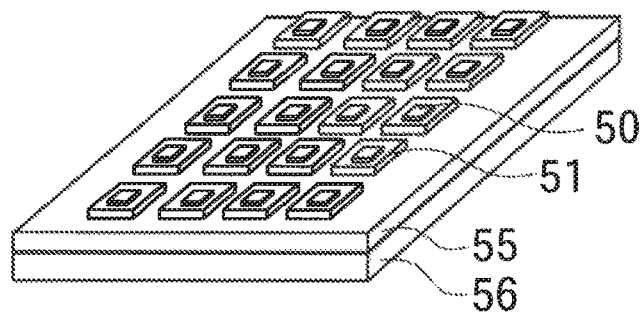
Figure 1:
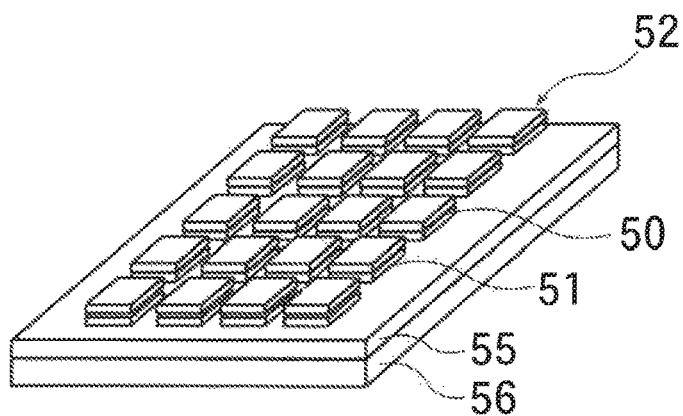
Figure 1:
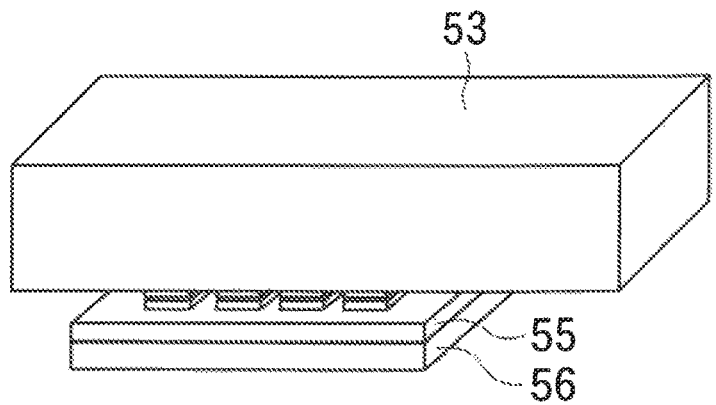

An anisotropic conductive adhesive used in the present invention comprises a conductive paste, and contains an epoxy-modified silicone resin serving as a binder resin, a metal chelate serving as a latent curing agent, and a metal component serving as a conductive component. The anisotropic conductive adhesive does not contain flux.

The epoxy-modified silicone resin serving as a binder resin is preferable due to its high viscosity stability and high thermal resistance. Examples of the epoxy-modified silicone resin used may include diglycidyl isocyanuryl-modified polysiloxanes represented by the following general formula (1).

carboxylate. Among these, glycidyl hexahydrobisphenol A and 3,4-epoxy cyclohexenyl methyl-3',4'-epoxy cyclohexene carboxylate can preferably be used, because a cured product of the compound certainly has a light transmittance suited to mounting an LED element and the compound has an excellent rapid curing property.

As the hydrogenated epoxy compound, hydrogenated products of the aforementioned heterocyclic epoxy compound and the alicyclic epoxy compound, and other well-known hydrogenated epoxy compounds can be used. The alicyclic epoxy compound, the heterocyclic epoxy compound, and the hydrogenated epoxy compound may each be used alone together with diglycidyl isocyanuryl-modified polysiloxane expressed by the general formula (1), or two or more types of these compounds may be used in combination. Another epoxy compound may be used together in addition to the epoxy compound(s) as long as the effects of the present invention are not impaired. Examples of the other epoxy compounds may include a glycidyl ether obtained by the reaction of epichlorohydrin with a polyhydric phenol, such as bisphenol A, bisphenol F, bisphenol S, tetramethyl General Formula (1)

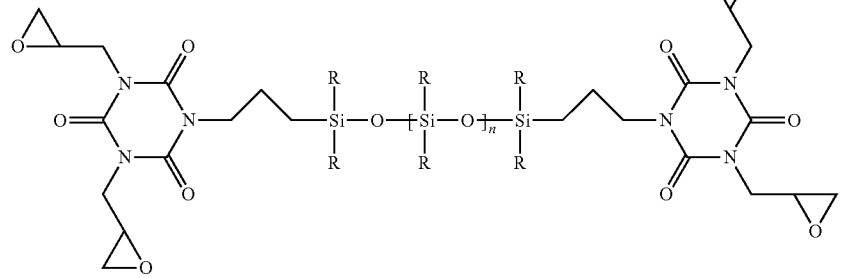

In the formula, R is an alkyl group such as a lower alkyl group having a carbon number of 1 to 6, or an aryl group such as a carbocyclic aromatic group and a heterocyclic aromatic group. Preferred concrete examples of the alkyl group may include a methyl group, an ethyl group, a propyl group, an isopropyl group, a butyl group, and an isobutyl group. A methyl group is particularly preferable as the alkyl group. Preferred concrete examples of the aryl group may include a phenyl group. n is a number of 1 to 40, is preferably a number of 1 to 9, and is more preferably a number of 1 or 2.

The epoxy-modified silicone resin may contain a heterocyclic epoxy compound, an alicyclic epoxy compound, a hydrogenated epoxy compound, or the like within the range of not impairing the effects of the present invention, in addition to the diglycidyl isocyanuryl-modified polysiloxane represented by the general formula (1).

As the heterocyclic epoxy compound, there can be mentioned an epoxy compound having a triazine ring. Example thereof may include 1,3,5-tris(2,3-epoxypropyl)-1,3,5-triazine-2,4,6-(1H,3H,5H)-trione (in other words, triglycidyl isocyanurate).

As the alicyclic epoxy compound, there can be preferably mentioned an alicyclic epoxy compound having two or more epoxy groups in a molecule. The alicyclic epoxy compound may be in a liquid form or a solid form. Specific examples thereof may include glycidyl hexahydrobisphenol A, and 3,4-epoxy cyclohexenyl methyl-3',4'-epoxy cyclohexene bisphenol A, diaryl bisphenol A, hydroquinone, catechol, resorcin, cresol, tetrabromo bisphenol A, trihydroxybiphenyl, benzophenone, bis-resorcinol, bisphenol hexafluoroacetone, tetramethyl bisphenol A, tetramethyl bisphenol F, tris(hydroxyphenyl)methane, bixylenol, phenol novolac, and cresol novolac; a polyglycidyl ether obtained by the reaction of epichlorohydrin with an aliphatic polyhydric alcohol, such as glycerin, neopentyl glycol, ethylene glycol, propylene glycol, butylene glycol, hexylene glycol, polyethylene glycol, and polypropylene glycol; a glycidyl ether ester obtained by the reaction of epichlorohydrin with a hydroxycarboxylic acid, such as p-oxybenzoic acid and β-oxynaphthoic acid; a polyglycidyl ester obtained from a polycarboxylic acid, such as phthalic acid, methyl phthalic acid, isophtalic acid, terephthalic acid, tetrahydrophthalic acid, endomethylene tetrahydrophthalic acid, endomethylene hexahydrophthalic acid, trimellitic acid, and a polymerized fatty acid; a glycidyl amino glycidyl ether obtained from aminophenol and aminoalkyl phenol; a glycidyl amino glycidyl ester obtained from an aminobenzoic acid; a glycidyl amine obtained from such as aniline, toluidine, tribromoaniline, xylylenediamine, diaminocyclohexane, bis-aminomethyl cyclohexane, 4,4'-diaminodiphenyl methane, and 4,4'-diaminodiphenyl sulfone; and well-known epoxy compounds such as epoxy polyolefin.

The central metal of the metal chelate compound is not specifically limited, and various metals such as aluminum, zirconium, and titanium can be used as the central metal.

Among the metal chelates, an aluminum chelate having a high reactivity is preferably used in particular.

As an aluminum chelate agent, there can be mentioned a complex compound in which three β-ketoenolate anions are coordinated to aluminum, as represented by the following general formula (2).

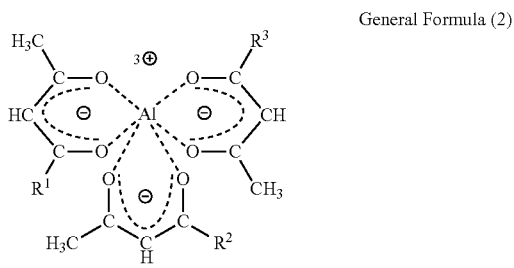

General Formula (2)

In the formula, $R^1$, $R^2$, and $R^3$ are each independently an alkyl group or an alkoxyl group. Examples of the alkyl group may include a methyl group, and an ethyl group. Examples of the alkoxyl group may include a methoxy group, an ethoxy group, and an oleyloxy group.

Specific examples of the aluminum chelate agent represented by the general formula (2) may include aluminum tris(acetylacetonate), aluminum tris(ethylacetoacetate), aluminum mono acetylacetonate bis(ethylacetoacetate), aluminum mono acetylacetonate bis oleyl acetoacetate, ethylacetoacetate aluminum diisopropylate, and alkylacetoacetate aluminum diisopropylate.

The metal chelate compound is desirably contained in the anisotropic conductive adhesive in a state of being impregnated into porous particles, and used as the latent curing agent. In addition to the metal chelate compound, a silane compound may be mixed as an auxiliary curing agent.

The metal component serving as a conductive component is constituted of a metal powder. As the metal constituting the metal component, gold, silver, copper, nickel, metal-plated resin particles, and the like can be used.

The metal powder preferably has a particle diameter of 3 μm or more and 10 μm or less as an average particle diameter from the viewpoint of ensuring application stability. The anisotropic conductive adhesive may contain a thermally-conductive filler. Examples of the thermally-conductive filler may include solder, lead-free solder, zinc oxide, boron nitride, and aluminum oxide. Among these, lead-free solder is desirable in terms of heat dissipation properties and cost.

In the present invention, the mixing ratio (% by weight) between the epoxy-modified silicone resin and the metal chelate compound in the anisotropic conductive adhesive is preferably 100:2 to 100:10. The mixing ratio (% by volume) between the epoxy-modified silicone resin and the metal component is preferably 100:1 to 100:30. On the other hand, the mixing ratio (% by volume) between the epoxy-modified silicone resin and the thermally-conductive filler is preferably 100:1 to 100:30.

<Manufacturing Process of Light Emitting Device>

Figure 2:
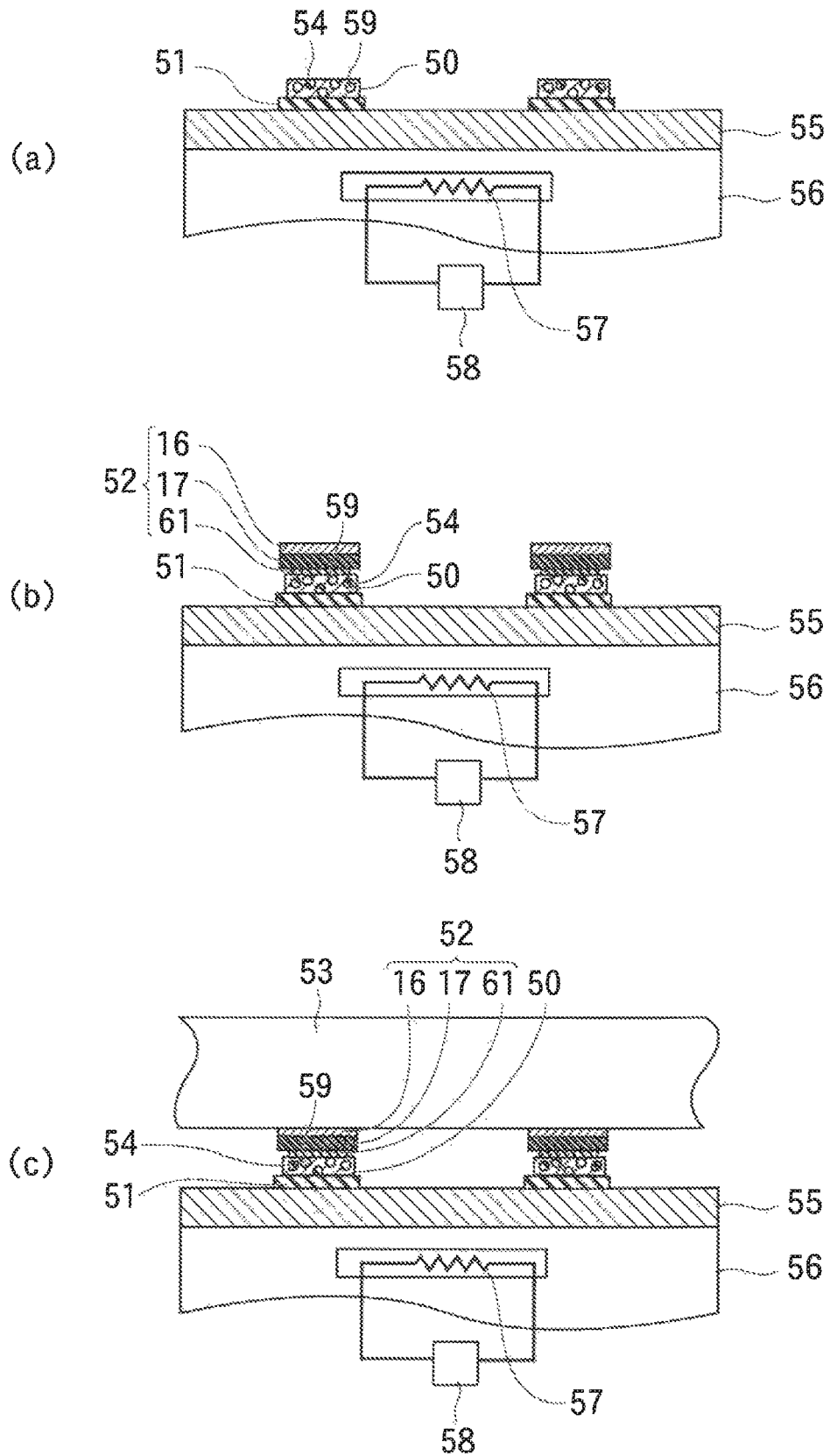
FIGS. 2(a) to 2(c) are (first) cross-sectional views for explaining the manufacturing process of the present invention.

First, as shown in FIG. 1(a), ceramic wiring boards 51 (each having a thickness of 0.4 mm) each of which has an aluminum (Al) wiring layer are disposed on a stage 55. As shown in FIG. 1(b), about 10 μg of an anisotropic conductive adhesive 50 is applied to the Al wiring layer of each wiring board 51, so that the Al wiring layer of the wiring board 51 is brought into contact with the anisotropic conductive adhesive 50. FIG. 2(a) shows a cross-sectional view of such a state. In the drawing, reference numeral 54 denotes conductive particles, and the conductive particles here are metal-plated resin particles. The particle diameter of the conductive particles 54 is desirably 5 μm or more and 7 μm or less. In the drawing, reference numeral 59 denotes a thermally-conductive filler. The thermally-conductive filler here is constituted of lead-free solder particles having a particle diameter of 3 μm or more and 10 μm or less.

The stage 55 is provided with a heating device 56. A power supply 58 feeds an electric current to a heating element 57 provided in the heating device 56, and the temperature of the stage 55 has risen in advance to a certain temperature by heat generated by the heating element 57. The stage 55 heated increases the temperatures of the wiring board 51 and the anisotropic conductive adhesive 50 disposed on the wiring board 51.

Next, as shown in FIGS. 1(c) and 2(b), LED elements 52 (each having a size of 0.65 mm×0.65 mm and a thickness of 0.36 mm) are disposed on the anisotropic conductive adhesive 50. In the LED element 52, a fluorescent layer 16 is disposed on one surface of a body semiconductor chip 17, and electrodes 61 are provided on the opposite surface thereof. The LED element 52 is disposed such that the electrodes 61 are in contact with the anisotropic conductive adhesive 50.

The fluorescent layer 16 used here has a protective layer on the surface thereof, and as shown in FIGS. 1(d) and 2(c), a pressing unit 53 provided in a pressure bonding device is brought into contact with the surface of the fluorescent layer 16 of the LED element 52.

The temperature of the pressing unit 53 is controlled so as to be kept at the order of room temperature of 20° C. or higher and 40° C. or lower. The temperature of the stage 55 is controlled such that the temperature of the wiring board 51 is 160° C. or higher and 210° C. or lower, and preferably 180° C. or higher and 190° C. or lower.

Figure 3:
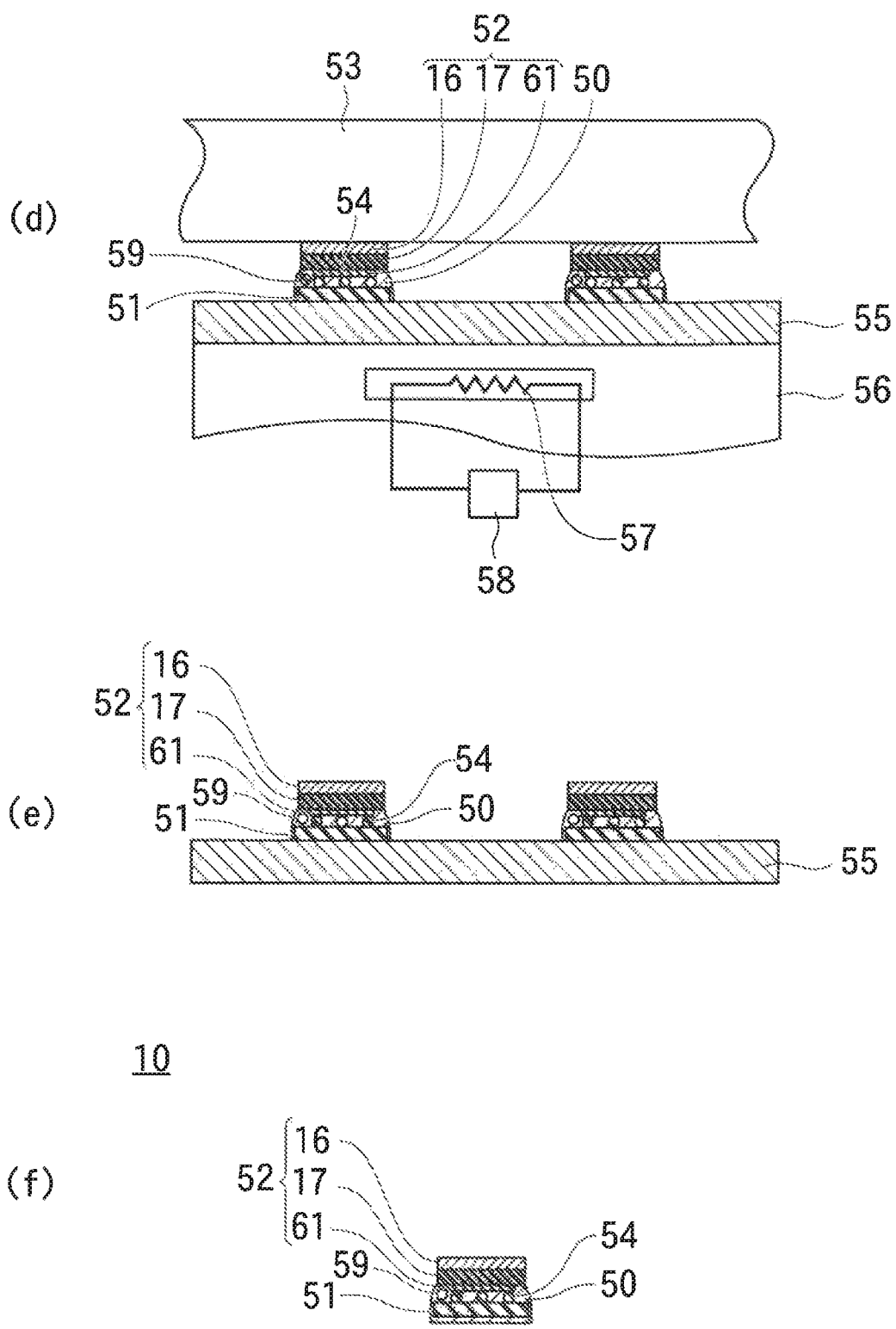
FIGS. 3(d) to 3(f) are (second) cross-sectional views for explaining the manufacturing process of the present invention.

When the pressing unit 53 presses the LED element 52 in this state, the anisotropic conductive adhesive 50 is pushed to the outside of the wiring board 51 by a pressing force applied from the pressing unit 53 to the LED element 52. The distance between the LED element 52 and the wiring board 51 becomes short. As shown in FIG. 3(d), the conductive particles 54 situated between the Al wiring layer of the wiring board 51 and the electrodes 61 of the LED element 52 are in contact with both of the Al wiring layer of the wiring board 51 and the electrodes 61, so that the electrodes 61 are electrically connected to the Al wiring layer of the wiring board 51 through the conductive particles 54.

The anisotropic conductive adhesive 50 is primarily heated by the heated wiring board 51, so that the temperature thereof is increased. Due to the temperature increase, the metal chelate compound contained in the anisotropic conductive adhesive 50 partly polymerizes the contained epoxy-modified silicone resin (diglycidyl isocyanuryl-modified polysiloxane). Then, the LED element 52 is bonded to the wiring board 51 by the compound obtained by the polymerization reaction.

The fluorescent layer 16 of the LED element 52 has a property in which it collapses when heated to 190° C. or higher. In this embodiment, since the temperature of the pressing unit 53 is set lower than that of the wiring board 51 having an upper limit temperature of 210° C. Thus, the temperature of the primarily-heated LED element 52 that is sandwiched between the wiring board 51 and the pressing unit 53 is made lower than 210° C., i.e., the upper limit temperature of the wiring board 51.

Since the fluorescent layer 16 tends to collapse when heated in a state of being pressed, a time for the pressing unit 53 to press the LED element 52 is set at 20 seconds or less, in order to prevent the collapse of the fluorescent layer 16.

When the press by the pressing unit 53 has been completed after a lapse of the pressing time, as shown in FIG. 3(e), the pressing unit 53 moves away from the LED elements 52. In this state, the LED element 52 is bonded to the wiring board 51, and thus the LED element 52 and the wiring board 51 are temporarily connected so as not to move in a relative manner.

The wiring board 51 and the LED element 52 temporarily connected thereto are conveyed into a heating oven while maintaining its temporarily connected state, to secondarily heat the wiring board 51, the anisotropic conductive adhesive 50, and the LED element 52. The temperature of the secondary heating by the heating oven is set lower than the temperature of the primary heating by the heating device 56 provided in the stage 55, and a heating time by the heating oven is set longer than the pressing time.

The secondary heating in the heating oven advances the polymerization reaction of the epoxy-modified silicone resin with the metal chelate compound. As a result, the anisotropic conductive adhesive 50 is cured and the LED element 52 is fixed to the wiring board 51 as final connection. In this manner, the light emitting device 10 as shown in FIG. 3(f) is obtained.

When the light emitting device 10 is energized, the body semiconductor chip 17 emits light. The wavelength of the radiated emission light is converted while passing through the fluorescent layer 16, and therefore white light is emitted from the light emitting device 10. Note that, since the anisotropic conductive adhesive 50 according to this embodiment contains no flux, there is no need to provide a cleaning step for cleaning the light emitting device 10.

<Measurement>

In the manufacturing process of the light emitting device 10, the temperature and pressing heating of the wiring board 51 were changed in the primary heating and the LED element 52 was pressed by the pressing unit 53, to thereby temporarily connect the LED element 52 to the wiring board 51 with the anisotropic conductive adhesive 50. At that time, the surface temperature of the LED element 52 on the side of the fluorescent layer 16 and the surface temperature of the wiring board 51 were measured. It is assumed that the temperature of the LED element 52 on the side of the fluorescent layer 16 is the same as the temperature of a surface of the pressing unit 53 that is brought into contact with the LED element 52. The conduction resistance between the LED element 52 and the wiring board 51 was measured, while applying a voltage to the wiring board 51, after removing the pressing unit 53 without heating by the heating oven. The following table 1 shows measurement results.

As for a conduction resistance, a resistance value was measured when a certain electric current was fed to each sample. "C" indicates a case where it is determined from the resistance value that no electrical connection is established. "A" indicates a case where the measured resistance value is equal to or less than a reference value. "B" indicates a case where although an electrical connection is established, the resistance value is more than the reference value.

A force to remove the LED element 52 from the wiring board 51 was also measured. "C" indicates a case where the polymerization of the anisotropic conductive adhesive 50 is insufficient and no temporal connection is achieved. "A" indicates a case where the temporal connection is achieved. "B" indicates a case where although the temporal connection is achieved, the removing force is less than a reference value.

In Table 1, the item of "fluorescent shape" indicates results of observing the shape of fluorescent particles in the fluorescent layer 16 with a microscope, after removing the pressing unit 53. "C" indicates a case where the fluorescent particles are largely deformed in the fluorescent layer 16. "A" indicates a case where the fluorescent particles are hardly deformed in the fluorescent layer 16. "B" indicates a case where the deformation is in the middle of "C" and "A". Even when the item of "fluorescent shape" is evaluated as "C" or "B", the sample is encompassed by the present invention as long as the fluorescent layer 16 does not collapse and functions.

It is apparent from the results of Table 1 that a good electrical connection and a good temporal connection state are obtained, when the temperature of the pressing unit 53 is 35° C. or lower, and the temperature of the wiring board 51 is 160° C. or higher and 210° C. or lower, and the pressing time is 20 seconds or more and 60 seconds or less.

REFERENCE SIGNS LIST

10 . . . light emitting device
50 . . . anisotropic conductive adhesive
51 . . . wiring board
52 . . . LED element
53 . . . pressing unit
54 . . . conductive particle
55 . . . stage
56 . . . heating device
57 . . . heating element
58 . . . power supply
59 . . . thermally-conductive filler
61 . . . electrode
16 . . . fluorescent layer
17 . . . body semiconductor chip

The invention claimed is:

1. A method for manufacturing a light emitting device, comprising:

TABLE 1

|  |  | Com. Ex. 1 | Com. Ex. 2 | Com. Ex. 3 | Ex. 1 | Ex. 2 | Ex. 3 | Ex. 4 | Ex. 5 | Ex. 6 | Ex. 7 |
|---|---|---|---|---|---|---|---|---|---|---|---|
| Temperature Setting (° C.) | Fluorescent Side | 160 | 180 | 190 | 35 | 35 | 35 | 35 | 35 | 35 | 35 |
|  | Substrate Side | 35 | 35 | 35 | 160 | 180 | 190 | 160 | 180 | 190 | 210 |
| Pressing Time (sec) |  | 60 | 60 | 60 | 60 | 60 | 60 | 20 | 20 | 20 | 20 |
| Fluorescent Shape |  | B | C | C | B | C | C | A | A | B | C |
| Temporal Connection |  | C | C | C | B | B | B | B | B | B | A |
| Conduction Resistance |  | C | C | C | B | A | A | B | A | A | A | a disposition step of disposing an LED element on an anisotropic conductive adhesive, which contains a polymerization component and a curing agent and which is disposed on a wiring board;

a primary heating step of increasing a temperature of the anisotropic conductive adhesive to cause a polymerization reaction of part of the polymerization component with the curing agent, while a pressing unit presses the LED element for a pressing time, to temporarily connect the LED element to the wiring board; and a secondary heating step of increasing temperatures of the wiring board, the anisotropic conductive adhesive, and the LED element, which are temporarily connected, to make final connection by the polymerization reaction of the polymerization component and curing of the anisotropic conductive adhesive, wherein the LED element has a fluorescent layer, the polymerization component contains an epoxy-modified silicone resin, a metal chelate compound is used as the curing agent, the pressing time is 20 seconds or more, a temperature of the pressing unit is controlled to be kept at 40° C. or lower during pressing, and in the primary heating step, the wiring board is pressed at a temperature of 160° C. or higher and 210° C. or lower for the pressing time.

2. The method for manufacturing a light emitting device according to claim 1, wherein the pressing time is 60 seconds or less.

3. The method for manufacturing a light emitting device according to claim 2, wherein the temperature of the wiring board is set lower in the secondary heating step than in the primary heating step, and a heating time for heating the wiring board in the secondary heating step is set longer than the pressing time.

4. The method for manufacturing a light emitting device according to claim 3, wherein the temperature of the pressing unit is controlled to be kept at 20° C. or higher during pressing.

5. The method for manufacturing a light emitting device according to claim 2, wherein the temperature of the pressing unit is controlled to be kept at 20° C. or higher during pressing.

6. The method for manufacturing a light emitting device according to claim 1, wherein the temperature of the wiring board is set lower in the secondary heating step than in the primary heating step, and a heating time for heating the wiring board in the secondary heating step is set longer than the pressing time.

7. The method for manufacturing a light emitting device according to claim 6, wherein the temperature of the pressing unit is controlled to be kept at 20° C. or higher during pressing.

8. The method for manufacturing a light emitting device according to claim 1, wherein the temperature of the pressing unit is controlled to be kept at 20° C. or higher during pressing.

* * * * *